United States Patent
Bull et al.

(10) Patent No.: US 11,402,726 B2
(45) Date of Patent: Aug. 2, 2022

(54) CAMERA WITH ALIGNABLE IMAGE SENSOR

(71) Applicant: Lucid Vision Labs, Inc., Richmond (CA)

(72) Inventors: Jeffrey Bull, New Westminster (CA); Alexander Rybolov, Richmond (CA); Roderick A. Barman, Vancouver (CA); Masahiro Takada, Delta (CA)

(73) Assignee: Lucid Vision Labs, Inc., Richmond (CA)

( * ) Notice: Subject to any disclaimer, the term of this patent is extended or adjusted under 35 U.S.C. 154(b) by 0 days.

(21) Appl. No.: 17/260,524

(22) PCT Filed: Jul. 16, 2019

(86) PCT No.: PCT/CA2019/050977
§ 371 (c)(1),
(2) Date: Jan. 14, 2021

(87) PCT Pub. No.: WO2020/014777
PCT Pub. Date: Jan. 23, 2020

(65) Prior Publication Data
US 2021/0274069 A1    Sep. 2, 2021

Related U.S. Application Data

(60) Provisional application No. 62/699,212, filed on Jul. 17, 2018.

(51) Int. Cl.
*H04N 5/225* (2006.01)
*G03B 17/02* (2021.01)
(Continued)

(52) U.S. Cl.
CPC ............ *G03B 17/02* (2013.01); *G03B 17/12* (2013.01); *G03B 17/55* (2013.01); *H05K 1/148* (2013.01);
(Continued)

(58) Field of Classification Search
CPC .................................................... H04N 5/2253
See application file for complete search history.

(56) References Cited

U.S. PATENT DOCUMENTS

| | | | |
|---|---|---|---|
| 4,485,407 A | 11/1984 | Bohm et al. | |
| 10,015,377 B2 | 7/2018 | Sesti et al. | |
| 2008/0188030 A1* | 8/2008 | Kang | H01L 27/14618 438/65 |

FOREIGN PATENT DOCUMENTS

| | | | |
|---|---|---|---|
| WO | 2015/018414 A1 | 2/2015 | |
| WO | WO-2015018414 A1 * | 2/2015 | ......... H05K 7/20454 |

* cited by examiner

*Primary Examiner* — Gary C Vieaux
(74) *Attorney, Agent, or Firm* — Nexus Law Group LLP; Nicholas P. Toth

(57) ABSTRACT

A camera has a lens mount and an image sensor for sensing images. A holder of the camera can captively hold the image sensor such that the image sensor is moveable relative to the lens mount when the image sensor is not attached to the holder. The holder is further operable to fixedly hold the image sensor such that the image sensor is unmoveable relative to the lens mount at an aligned position of the image sensor when the image sensor is attached to the holder. The image sensor may be attached to a printed circuit board. The holder may include first and second rails comprising first and second printed circuit boards, respectively. The holder is then operable to fixedly hold the image sensor by the printed circuit board being soldered to at least one of the first and second printed circuit boards.

18 Claims, 9 Drawing Sheets

(51) Int. Cl.
    *H05K 1/14*         (2006.01)
    *H05K 3/00*         (2006.01)
    *H05K 3/30*         (2006.01)
    *H05K 7/14*         (2006.01)
    *G03B 17/12*       (2021.01)
    *G03B 17/55*       (2021.01)
    *G02B 7/14*        (2021.01)

(52) U.S. Cl.
    CPC ............ *H05K 3/0008* (2013.01); *H05K 3/303* (2013.01); *H05K 7/1427* (2013.01); *G02B 7/14* (2013.01); *H04N 5/2252* (2013.01); *H04N 5/2253* (2013.01); *H04N 5/2254* (2013.01); *H05K 2203/04* (2013.01)

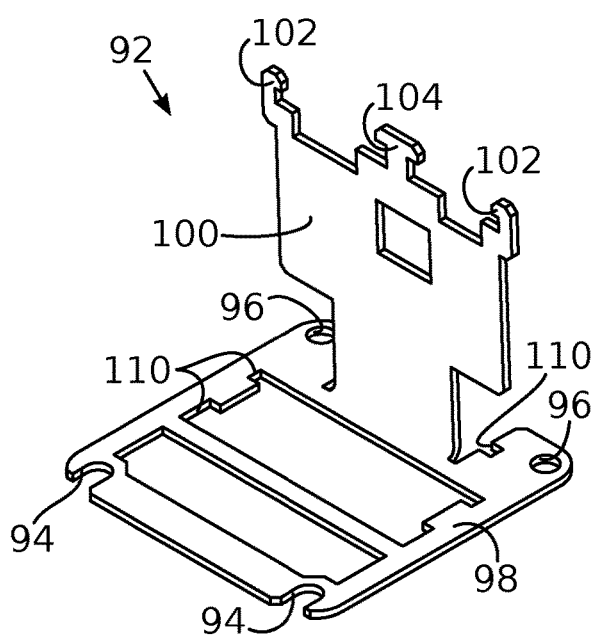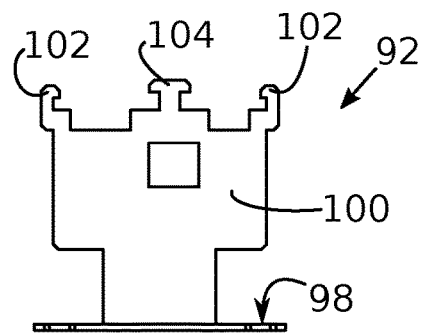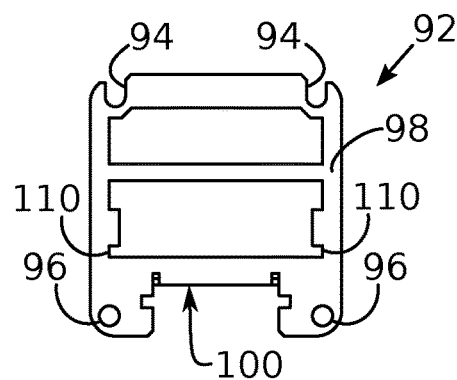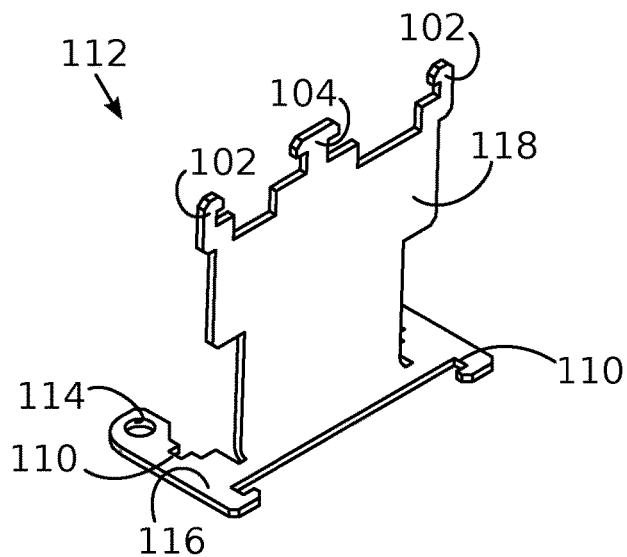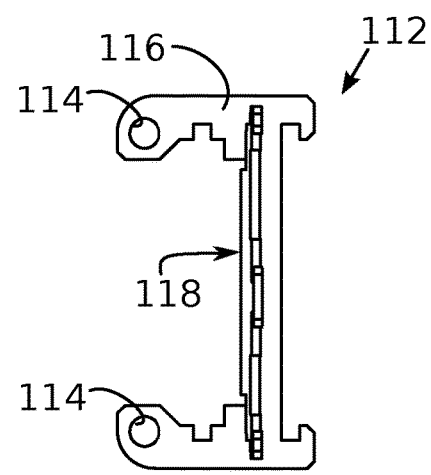
FIG. 17
FIG. 18
FIG. 19
FIG. 20
FIG. 21

CAMERA WITH ALIGNABLE IMAGE SENSOR

BACKGROUND OF THE INVENTION

1. Field of Invention

This invention relates to image sensing and, in particular, to a camera having an alignable image sensor and an adjustable circuit holder.

2. Description of Related Art

Digital cameras include a lens in front of an image sensor. The lens is typically mounted to a lens mount and the image sensor attached to the lens mount. Properly focused images are obtained from the image sensor when the image sensor is properly aligned in relation to the lens. Alignment of the image sensor is intended to ensure that the lens and the image sensor are parallel to each other and at a specifiable distance from each other. Typically, the image sensor is also in rotational alignment with the lens mount so that the tops and bottoms of both the image sensor and the lens mount lie in one plane.

Alignment of the image sensor is conventionally achieved by manufacturing various components to within manufacturing tolerances. However, the compounding of multiple manufacturing tolerances associated with multiple assembled components limits the precision to which image sensor alignment can be achieved.

Some cameras include one or more threaded screws with coil springs for adjusting the position of an image sensor relative to the lens mount. However, a combination of screws and springs is mechanically complicated, cumbersome to manually adjust, limited in precision by the thread size of the threaded screws, and subject to subsequent misadjustment over time.

In some cameras, shims of varying thicknesses are installed to adjust the position of the image sensor relative to the lens mount. However, the use of shims permits adjustment only to a limited number of fixed positions according to available shim thicknesses, selecting an appropriate shim thickness is tedious, and employing a large inventory of available shims at differing thicknesses increases costs.

Various forms of cooling and other thermal management techniques are employed to ensure proper operation of electronic components in digital cameras. Such thermal management techniques include the use of heat sinks in proper placement relative to the electronic components. However, the conventional use of heat sinks can make the electronic circuitry inside a digital camera bulky.

An object of the invention is to address the above shortcomings.

SUMMARY

The above shortcomings may be addressed by providing, in accordance with one aspect of the invention, a camera. The camera includes: (a) a lens mount; (b) an image sensor for sensing images; and (c) a holder for holding the image sensor, the holder being operable to captively hold the image sensor such that the image sensor is moveable relative to the lens mount toward an aligned position of the image sensor, and operable to fixedly hold the image sensor at said aligned position such that the image sensor is unmoveable relative to the lens mount.

The holder may be operable to captively hold the image sensor when the image sensor is not attached to the holder, and the holder is operable to fixedly hold the image sensor when the image sensor is attached to the holder. The holder may be removably attachable to the lens mount. The image sensor may be removably attachable to the holder. The image sensor may be removably attachable to the holder by soldering. The image sensor may be removably attachable to the holder by adhesion. The camera may further include a support for resiliently supporting the image sensor when the image sensor is captively held by the holder. The support may be made of an elastic material. The support may be operable to seal the image sensor against dust ingress. The support may be made of a foam material. The support may be made of a rubber material. The holder may include first and second rails removably attachable to the lens mount at opposing sides of the lens mount. The holder may be operable to provide an electrical ground path between the image sensor and the lens mount. The electrical ground path may be dimensioned for being connected by soldering when the image sensor is fixedly held by the holder. The image sensor may be moveable to an aligned position relative to the lens mount when the image sensor is captively held by the holder. The image sensor may be robotically moveable to the aligned position.

In accordance with another aspect of the invention, there is provided a camera. The camera includes: (a) sensing means for sensing images; (b) lens mounting means for guiding light toward the sensing means; and (c) holder means for holding the sensing means, the holder means being operable to captively hold the sensing means such that the sensing means is moveable relative to the lens mounting means, and operable to fixedly hold the sensing means such that the sensing means is unmoveable relative to the lens mounting means.

The camera may further include support means for resiliently supporting the sensing means when the sensing means is captively held by the holder means.

In accordance with another aspect of the invention, there is provided a camera. The camera includes: (a) a lens mount; (b) an image sensor for sensing images; and (c) a holder for holding the image sensor, the holder being operable to fixedly hold the image sensor such that the image sensor is unmoveable relative to the lens mount at an aligned position of the image sensor subsequent to the image sensor having been aligned by gripping the image sensor.

The holder may be removably attachable to the lens mount. The image sensor may be removably attachable to the holder. The image sensor may be removably attachable to the holder by soldering. The image sensor may be removably attachable to the holder by adhesion. The holder may be operable to captively hold the image sensor such that the image sensor is moveable relative to the lens mount when the image sensor is captively held and not attached to the holder. The holder may be operable to fixedly hold the image sensor at the aligned position when the image sensor is attached to the holder. The camera may further include a support for resiliently supporting the image sensor when the image sensor is captively held by the holder. The support may be made of an elastic material. The support may be made of a foam material. The support may be operable to seal the image sensor against dust ingress. The support may be a dust seal for sealing the image sensor against dust ingress when the image sensor is held by the holder. The dust seal may be made of an elastic material. The dust seal may be made of a foam material. The holder may be a single-piece holder. The holder may include first and second rails removably attachable to the lens mount at opposing sides of the lens mount. The first and second rails may include first and second printed circuit boards, respectively. The image sensor may be attachable to a printed circuit board. The image sensor may be attachable to the holder by solder. The solder may extend between the printed circuit board and one or both of the first and second printed circuit boards. The printed circuit board may have a thickness selected such that a solder thickness of the solder is less than or equal to 0.5 mm. The holder may be operable to provide an electrical ground path between the image sensor and the lens mount. The electrical ground path may be dimensioned for being connected by soldering when the image sensor is fixedly held by the holder. The image sensor may be moveable to an aligned position relative to the lens mount when the image sensor is being gripped. The image sensor may be robotically moveable to the aligned position. The holder may be operable to captively hold the image sensor when the image sensor is not attached to the holder, and the holder is operable to fixedly hold the image sensor when the image sensor is attached to the holder. The dust seal may be operable to resiliently support the image sensor when the image sensor is captively held by the holder.

In accordance with another aspect of the invention, there is provided a camera. The camera includes: (a) sensing means for sensing images; (b) lens mounting means for guiding light toward the sensing means; and (c) holder means for holding the sensing means, the holder means being operable to fixedly hold the sensing means such that the sensing means is unmoveable relative to the lens mounting means subsequent to the sensing means having been aligned by gripping the sensing means when the sensing means is moveably proximate to the holder means.

In accordance with another aspect of the invention, there is provided a method of installing an image sensor of a camera. The method involves: (a) placing the image sensor at a lens mount of the camera; (b) fastening a holder to the lens mount so as to captively hold the image sensor by the holder such that the image sensor is moveable relative to the lens mount; (c) aligning the image sensor to the lens mount; and (d) attaching the image sensor to the holder so as to fixedly hold the image sensor by the holder such that the image sensor is unmoveable relative to the lens mount.

Step (a) may involve supporting the image sensor by a resilient support at the lens mount. Supporting the image sensor by a resilient support at the lens mount may involve installing the resilient support at the lens mount. Installing the resilient support at the lens mount may involve installing the resilient support made of an elastic material. Installing the resilient support made of an elastic material may involve installing the resilient support made of foam. Step (c) may involve generating an image by a pattern projector and directing the image toward the image sensor. Step (c) may involve processing the image by a camera processor connected to the image sensor so as to produce a processed image. Step (c) may involve determining the relative alignment of the image sensor to the lens mount on the basis of the processed image. Determining the relative alignment of the image sensor to the lens mount on the basis of the processed image may involve determining the relative alignment by the camera processor. Determining the relative alignment of the image sensor to the lens mount on the basis of the processed image may involve determining the relative alignment by a second processor other than the camera processor. Step (c) may involve robotically moving the image sensor. Robotically moving the image sensor may involve grasping the image sensor between robotic fingers. Robotically moving the image sensor may involve moving the image sensor to a new position calculated on the basis of the relative alignment.

In accordance with another aspect of the invention, there is provided a method of installing an image sensor of a camera. The method involves: (a) fastening a holder to a lens mount of the camera, the holder being operable to hold the image sensor; (b) grasping, by a gripper, the image sensor proximate to the holder; (c) by the gripper, aligning the image sensor to an aligned position of the image sensor relative to the lens mount; and (d) attaching the image sensor to the holder so as to fixedly hold the image sensor by the holder such that the image sensor is unmoveable relative to the lens mount at the aligned position.

Step (a) may involve fastening the holder so as to captively hold the image sensor such that the image sensor is moveable relative to the lens mount. Step (a) may further involve installing a resilient support at the lens mount for resiliently supporting the image sensor when the image sensor is captively held by the holder. Step (b) may involve gripping the image sensor by gripping a printed circuit board to which the image sensor is attached. Step (c) may involve generating an image and directing the image toward the image sensor. Generating the image may involve generating by a pattern projector. Step (c) may involve producing by a camera processor of the camera a processed image in response to the image. Step (c) may involve processing the image by a camera processor connected to the image sensor so as to produce a processed image. Step (c) may involve determining the relative alignment of the image sensor to the lens mount in response to the processed image. Determining the relative alignment of the image sensor to the lens mount in response to the processed image may involve determining the relative alignment by the camera processor. Determining the relative alignment of the image sensor to the lens mount in response to the processed image may involve determining the relative alignment by a second processor other than the camera processor. Step (c) may involve moving the image sensor to a new position calculated in response to the relative alignment. Step (c) may involve robotically moving the image sensor. Robotically moving the image sensor may involve grasping the image sensor between robotic fingers. Robotically moving the image sensor may involve moving the image sensor to a new position calculated in response to the relative alignment. The method may further involve fastening a lens to the lens mount. Step (c) may involve determining the relative alignment in response to an image quality of the processed image. Step (d) may involve soldering the printed circuit board to at least one holder printed circuit board of the holder when the at least one holder printed circuit board is attached to the lens mount. Step (d) may involve adhering the printed circuit board to at least one holder printed circuit board of the holder when the at least one holder printed circuit board is attached to the lens mount. Step (d) may involve soldering the printed circuit board, to which the image sensor is attached, to first and second printed circuit boards of the holder when the first and second printed circuit boards are attached to the lens mount at opposing sides of the lens mount. Step (d) may involve adhering the printed circuit board, to which the image sensor is attached, to first and second printed circuit boards of the holder when the first and second printed circuit boards are attached to the lens mount at opposing sides of the lens mount. Step (d) may further involve soldering the printed circuit board after adhering the printed circuit board. Step (a) may involve fastening to the lens mount the holder operable to captively hold the image sensor such that the image sensor is moveable relative to the lens mount. Step (a) may involve supporting the image sensor by a resilient support at the lens mount. Supporting the image sensor by a resilient support at the lens mount may involve installing the resilient support at the lens mount. Installing the resilient support at the lens mount may involve installing the resilient support made of an elastic material. Installing the resilient support made of an elastic material may involve installing the resilient support made of foam.

In accordance with another aspect of the invention, there is provided a camera. The camera includes: (a) a first printed circuit board comprising a first circuit component; (b) a second printed circuit board; (c) a PCB holder for holding the first and second printed circuit boards spaced apart from each other and pivotable relative to each other; and (d) a housing for enclosing the first and second printed circuit boards and the PCB holder, the PCB holder being dimensioned for fastening to the housing such that the first and second printed circuit boards are not parallel to each other and the first circuit component is placed in thermal communication with the housing.

The second printed circuit board may include a second circuit component. The second printed circuit board may support a second circuit component. The second circuit component may be placed in thermal communication with the PCB holder when the second printed circuit board is held by the PCB holder. The second circuit component may be placed in thermal communication with the housing when the PCB holder is fastened to the housing. The first and second circuit components may be placed in thermal communication at opposing sides of the housing, respectively. The first printed circuit board may include a third circuit component. The first printed circuit board may support a third circuit component. The first and third circuit components may be disposed on opposing sides of the first printed circuit board. The third circuit component may be in thermal communication with the PCB holder when the first printed circuit board is held by the PCB holder. The first and second printed circuit boards may form part of a single flexible printed circuit. The camera may include a backplane in electrical communication with the first and second printed circuit boards. Each of the first and second printed circuit boards may be pivotable relative to the backplane. The backplane may include first and second backplane sections. The camera may further include first and second external connectors attached to the first and second backplane sections, respectively. The housing may define first and second apertures dimensioned for sealedly receiving the first and second external connectors, respectively. The PCB holder may include first and second PCB holder members. The camera may further include first and second elastic connectors for removably attaching the first and second PCB holder members to the backplane such that the first and second PCB holder members are pivotable relative to the backplane, respectively. The first PCB holder member may include a first plate and a first flange projecting from the first plate. The second PCB holder member may include a second plate and a second flange projecting from the second plate. The first and second plates may be removably attachable to the backplane. The first and second flanges may be dimensioned for fastening to the housing. The first and second flanges may be resiliently slidable relative to each other when the PCB holder is attached to the backplane and not fastened to the housing. The first flange may be dimensioned for fastening to the housing at opposing sides of the housing. The first flange may include a loose-fit opening for fastening the first flange to the housing at one of the sides of the housing. The second flange may be dimensioned for fastening to the housing at the one side of the housing. The loose-fit opening may be an open-ended slot. The first and second PCB holder members may be dimensioned for aligning the first and second printed circuit boards parallel to the opposing sides of the housing when the PCB holder is fastened to the housing, respectively.

In accordance with another aspect of the invention, there is provided a method of installing an image processing assembly of a camera having a housing, the method involving: (a) inserting the image processing assembly into the housing such that an external connector of the image processing assembly sealedly extends through an aperture of the housing disposed at a first end of the housing; (b) sliding at least one of first and second flanges of a PCB holder of the image processing assembly relative to the other of the first and second flanges until first and second printed circuit boards of the image processing assembly are not parallel to each other and a first circuit component supported by the first printed circuit board is placed in thermal communication with the housing; and (c) fastening the first and second flanges to the housing at a second end of the housing opposite the first end.

Step (a) may involve inserting such that a second external connector of the image processing assembly sealedly extends through a second aperture of the housing disposed at the first end. Step (b) may involve sliding until a second circuit component supported by the second printed circuit board is placed in thermal communication with the housing such that the first and second circuit components are in thermal communication at opposing sides of the housing. Step (b) may involve sliding until the first and second printed circuit boards are aligned parallel to the opposing sides of the housing, respectively. Step (c) may involve fastening the first flange at opposing sides of the housing, the first flange being fastened to the housing at one of the sides of the housing via a loose-fit opening of the first flange. Step (c) may involve fastening the second flange to the housing at the one side of the housing. Step (c) may involve fastening the first flange at opposing sides of the housing, the first flange being fastened to the housing at one of the sides of the housing via an open-ended slot of the first flange.

In accordance with another aspect of the invention, there is provided a camera. The camera includes: (a) a printed circuit board comprising first and second circuit components disposed on opposing sides of the printed circuit board; (b) a PCB holder for holding the printed circuit board, the first circuit component being in thermal communication with the PCB holder when the printed circuit board is held by the PCB holder; and (c) a housing for enclosing the printed circuit board and the PCB holder, the PCB holder being dimensioned to fasten to the housing such that the second circuit component is placed in thermal communication with the housing.

The PCB holder may include a plate dimensioned for thermal communication between the first circuit component and the PCB holder. The PCB holder may further include a flange projecting from the plate. The flange may be dimensioned for fastening to the housing. The camera may further include a backplane in electrical communication with the printed circuit board. The backplane and the PCB holder may be removably attachable to each other. The printed circuit board may be dimensioned for being held between the backplane and the flange. The camera may further include a second printed circuit board. The second printed circuit board may include a third circuit component in thermal communication with one of the PCB holder and the housing when the second printed circuit board is held by the PCB holder and the PCB holder is fastened to the housing. The second printed circuit board may include a fourth circuit component. The third and fourth circuit components may be disposed on opposing sides of the second printed circuit board. The fourth circuit component may be in thermal communication with the other of the PCB holder and the housing when the second printed circuit board is held by the PCB holder and the PCB holder is fastened to the housing. The PCB holder may include first and second PCB holder members. The first PCB holder member may include the plate and the flange. The second PCB holder member may include a second plate dimensioned for thermal communication between one of the third and fourth circuit components and the second PCB holder. The second PCB holder may further include a second flange projecting from the second plate. The second flange may be dimensioned for fastening to the housing. The second printed circuit board may be dimensioned for being held between the backplane and the second flange. Each of the first and second PCB holder members may be removably attachable to the backplane. The camera may further include first and second elastic connectors for removably attaching the first and second PCB holder members to the backplane, respectively, such that the flange and the second flange are adjustable relative to each other when the PCB holder is attached to the backplane and not fastened to the housing. The camera may further include first and second elastic connectors for removably attaching the first and second PCB holder members to the backplane, respectively, such that the flange and the second flange are resiliently slidable relative to each other when the PCB holder is attached to the backplane and not fastened to the housing. The flange and the second flange may be adjustable relative to each other by being slidable relative to each other. The flange and the second flange may be adjustable relative to each other by being resiliently adjustable relative to each other. The flange and the second flange may be slidable relative to each other by being resiliently slidable relative to each other. The flange may be dimensioned to fasten to the housing at a first side of the housing. The flange may extend perpendicular to the plate. The second flange may be dimensioned to fasten to the housing at a second side of the housing opposite the first side. The second flange may extend perpendicular to the second plate. One of the flange and the second flange may be dimensioned for fastening to the housing at both the first and second sides of the housing. The one of the flange and the second flange may define an open-ended slot for receiving a fastener for fastening the one of the flange and the second flange to the housing. The plate may extend between a top plate edge and a bottom plate edge opposite the top plate edge. The first PCB holder member may be removably attachable to the backplane at the bottom plate edge. The flange may extend perpendicularly from the plate at the top plate edge. The second plate may extend between a second top plate edge and a second bottom plate edge opposite the second top plate edge. The second PCB holder member may be removably attachable to the backplane at the second bottom plate edge. The second flange may extend perpendicularly from the second plate at the second top plate edge. The flange and the second flange may be substantially parallel and adjacent to each other when the first and second PCB holder members are attached to the backplane. The backplane may include first and second backplane sections. The camera may further include first and second external connectors attached to the first and second backplane sections, respectively. The housing may define first and second apertures. The first and second external connectors may be dimensioned to sealedly extend through the first and second apertures, respectively.

In accordance with another aspect of the invention, there is provided a camera. The camera includes: (a) first PCB means for supporting a first circuit component; (b) PCB holder means for holding the first PCB means; and (c) housing means for enclosing the first PCB means and the PCB holder means, the PCB holder means being dimensioned to fasten to the housing such that the first circuit component is placed in thermal communication with the housing means.

The first PCB means may include a second circuit component. The first and second circuit components may be disposed on opposing sides of the first PCB means. The second circuit component may be in thermal communication with the PCB holder means when the first PCB means is held by the PCB holder means. The camera may further include second PCB means comprising a second circuit component. The PCB holder means may be operable to hold the first and second PCB means. The second circuit component may be in thermal communication with the PCB holder means when the second PCB means is held by the PCB holder means. The first and second PCB means may form part of means for integrally and flexibly supporting the first and second circuit components.

In accordance with another aspect of the invention, there is provided a camera. The camera includes: (a) PCB means for supporting first and second circuit components disposed on opposing sides of the PCB means; (b) PCB holder means for holding the PCB means, the first circuit component being in thermal communication with the PCB holder means when the PCB means is held by the PCB holder means; and (c) housing means for enclosing the PCB means and the PCB holder means, the PCB holder means being dimensioned to fasten to the housing means such that the second circuit component is placed in thermal communication with the housing means.

The camera may further include second PCB means for supporting a third circuit component in thermal communication with one of the PCB holder means and the housing means when the second PCB means is held by the PCB holder means and the PCB holder means is fastened to the housing means. The second PCB means may include a fourth circuit component. The third and fourth circuit components may be disposed on opposing sides of the second PCB means. The fourth circuit component may be in thermal communication with the other of the PCB holder means and the housing means when the second PCB means is held by the PCB holder means and the PCB holder means is fastened to the housing means. The camera may further include first and second connections means for removably attaching the PCB holder means to a backplane.

The foregoing summary is illustrative only and is not intended to be in any way limiting. Other aspects and features of the present invention will become apparent to those of ordinary skill in the art upon review of the following description of embodiments of the invention in conjunction with the accompanying figures and claims.

BRIEF DESCRIPTION OF THE DRAWINGS

In drawings which illustrate by way of example only embodiments of the invention:

FIG. 17 is a perspective view of a slotted member of the PCB holder shown in FIGS. 15 and 16, showing the slotted flange projecting at a right angle from an adjoining plate;

FIG. 18 is a reverse elevation view of the slotted member shown in FIG. 17;

FIG. 19 is a top view of the slotted member shown in FIGS. 17 and 18;

FIG. 20 is a perspective view of an unslotted member of PCB holder shown in FIGS. 15 and 16, showing the unslotted flange projecting at a right angle from a plate; and FIG. 21 is a bottom view of the unslotted member shown in FIG. 20.

DETAILED DESCRIPTION

A camera includes: (a) sensing means for sensing images; (b) lens mounting means for guiding light toward the sensing means; and (c) holder means for holding the sensing means, the holder means being operable to captively hold the sensing means such that the sensing means is moveable relative to the lens mounting means, and operable to fixedly hold the sensing means such that the sensing means is unmoveable relative to the lens mounting means.

The same or a different camera includes: (a) PCB means for supporting one or more circuit components; (b) PCB holder means for holding the PCB means; and (c) housing means for enclosing the PCB means and the PCB holder means, the PCB holder means being dimensioned to fasten to the housing means such that at least one of the circuit components is placed in thermal communication with the housing means. Another of the circuit components may be placed in thermal communication with the PCB holder means when the PCB means is held by the PCB holder means.

Figure 1:
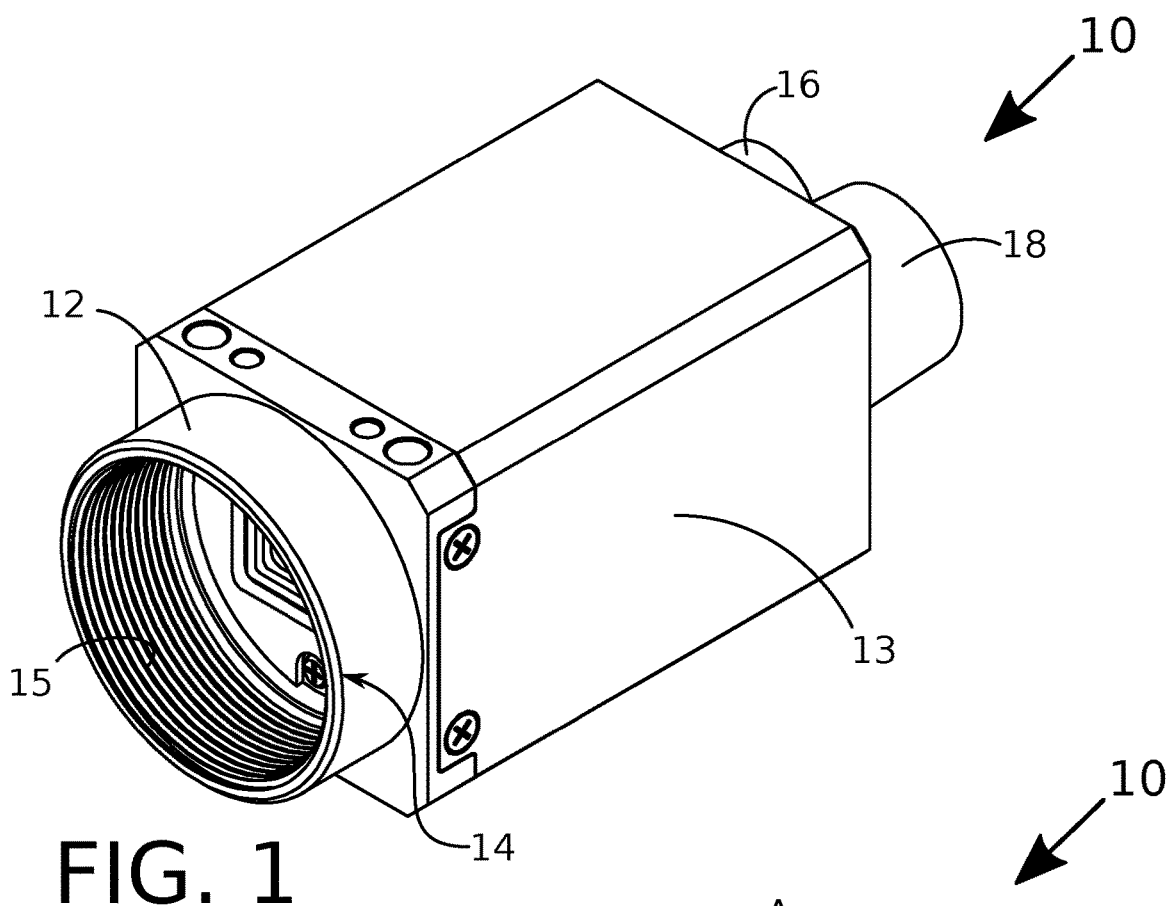
FIG. 1 is a perspective view of a camera according to a first embodiment of the invention.

Referring to FIG. 1, the camera according to a first embodiment of the invention is shown generally at 10. The camera 10 functions to produce images by image sensing and processing. The camera 10 includes a lens mount 12 that is attachable to a housing 13. The lens mount 12 defines a flange edge 14 and includes inward facing threads 15 for receiving an interchangeable lens (not shown) that is ordinarily used in conjunction with the camera 10 to produce images. The dimensions of the threads 15 and relative placement of the interchangeable lens (not shown) when mounted to the lens mount 12 typically conforms to an industry standard. For example, the lens mount 12 may be dimensioned for compatibility with known C-mount type lenses (not shown).

The external connectors 16 and 18 facilitate providing electrical power to the camera 10 from an external power supply (not shown) and facilitate transmitting images from the camera 10 to an external image receiver (not shown) for further processing and/or display. In the first embodiment, the smaller connector 16 is typically employed for electrically powering the camera 10 and for general-purpose input/output signals such as operational control signals. Additionally or alternatively, the larger connector 18 may be employed to electrically power the camera 10. In the first embodiment, the larger connector 18 is typically employed for streaming image data and is preferably compatible with the ethernet family of communications technologies.

In variations of embodiments, the camera 10 can be made dust resistant or dust proof, water-resistant or waterproof, or a combination thereof. In the first embodiment, the camera 10 is compliant with the IP67 (Ingress Protection) standard. In variations, other ingress protection ratings are possible.

Figure 2:
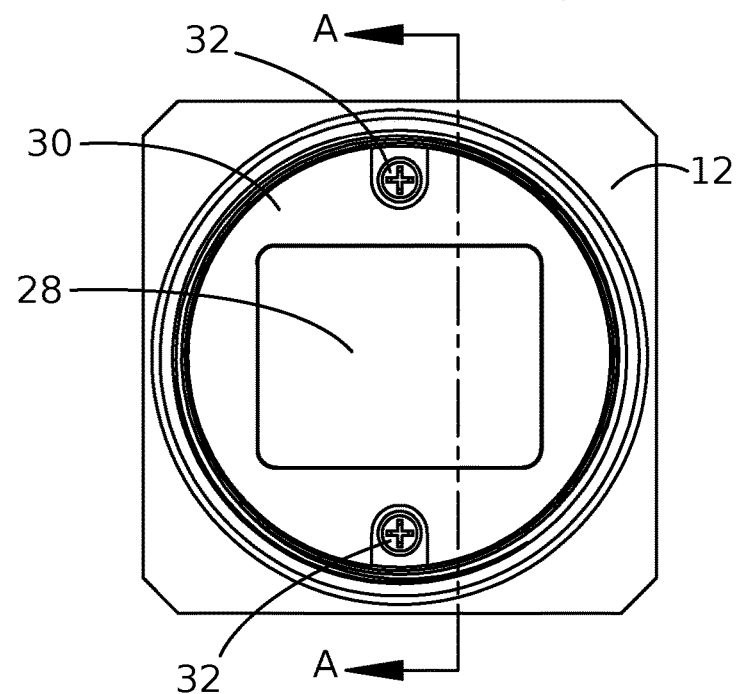
FIG. 2 is a front view of the camera shown in FIG. 1, showing a lens mount.

Referring to FIG. 2, the lens mount 12 guides light toward the interior of the camera 10 where it can be imaged.

Figure 3:
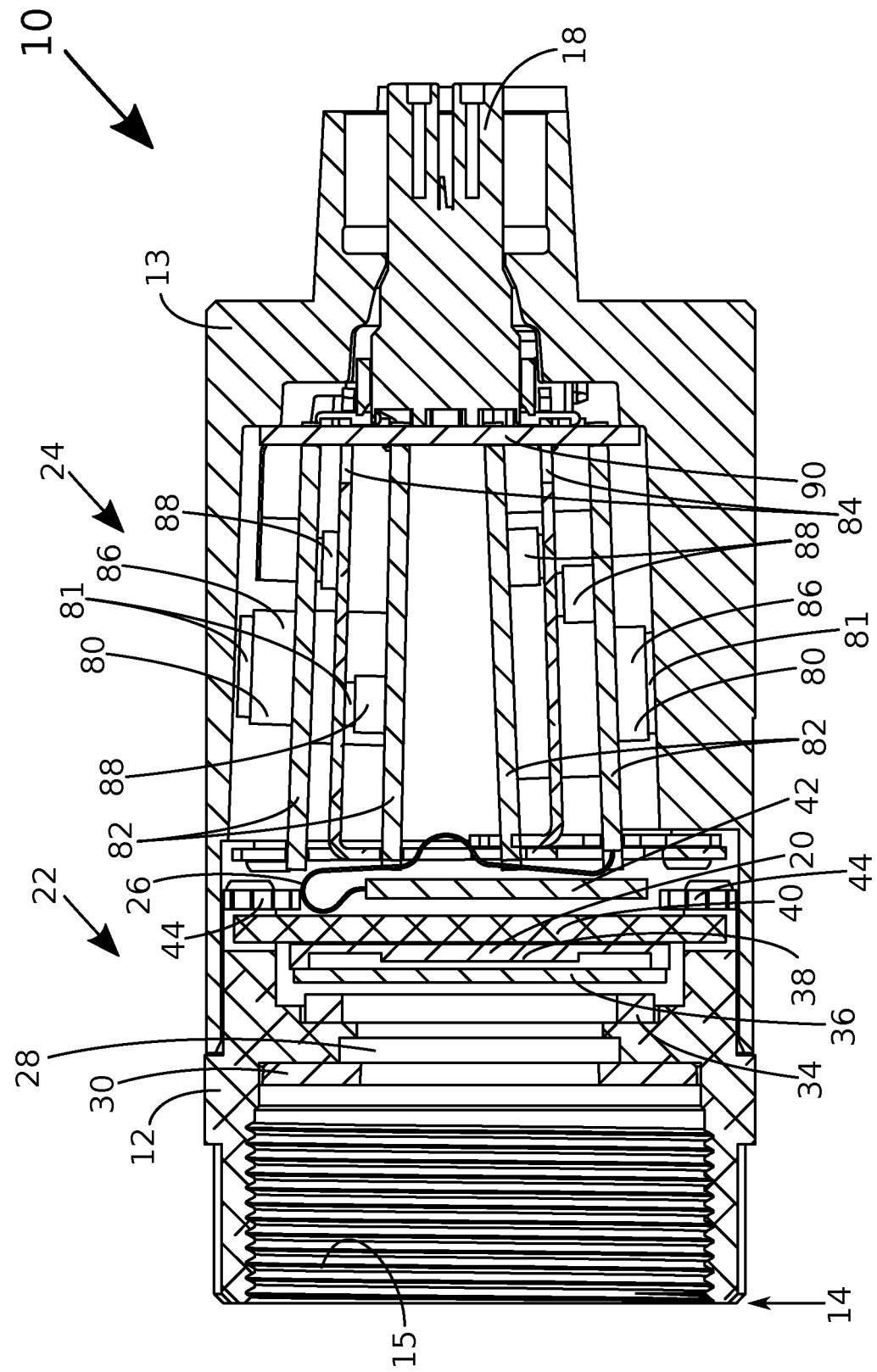
FIG. 3 is a sectional view along lines A-A of FIG. 2, showing an electronic component in thermal communication with a housing.

The sectional view shown in FIG. 3 is taken along lines A-A of FIG. 2. The lens mount 12 and an image sensor 20 form part of an image sensing assembly 22 that is attached to the housing 13. An image processing assembly 24 includes the external connectors 16 and 18 projecting outward within the housing 13.

As can be seen in FIG. 3, the image sensing assembly 22 and the image processing assembly 24 are in electrical communication with each other via an electrical cable 26. In the first embodiment, the electrical cable 26 is implemented in the form of a flexible printed circuit. In general, however, any form of electrical connection(s) may be suitably employed.

Figure 4:
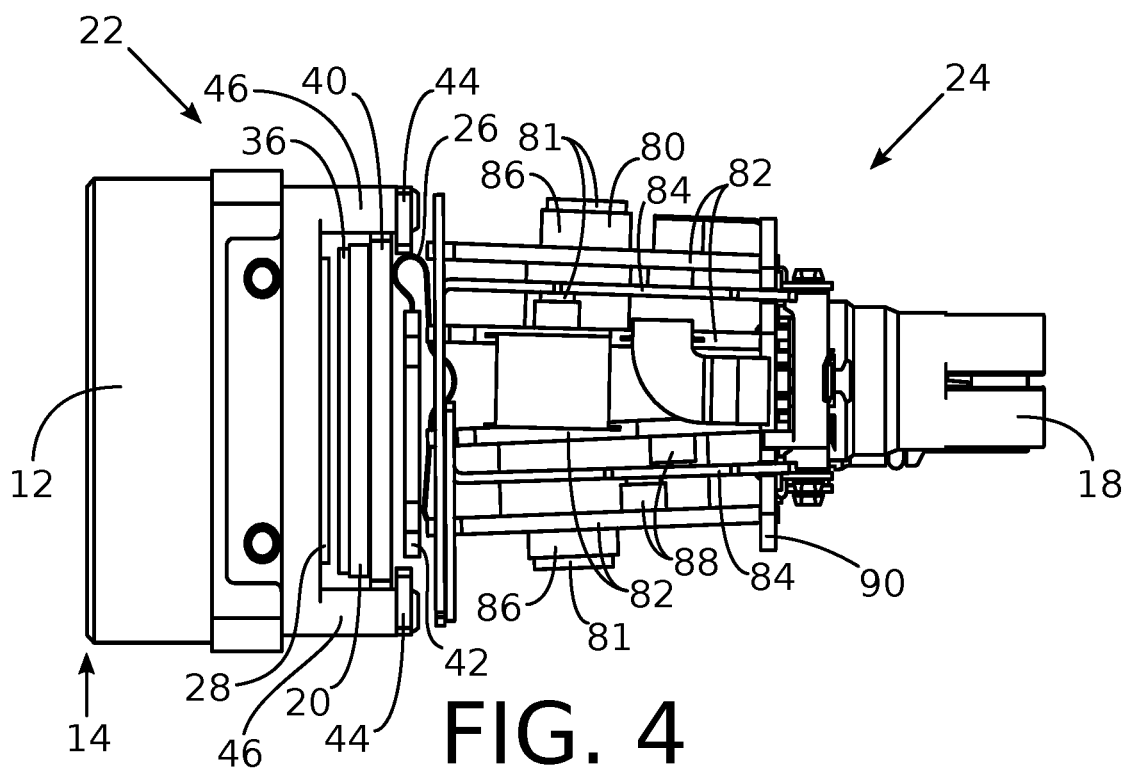
FIG. 4 is a side view of a portion of the camera shown in FIG. 1, showing an image sensing assembly and an image processing assembly in electrical communication with each other.
Figure 5:
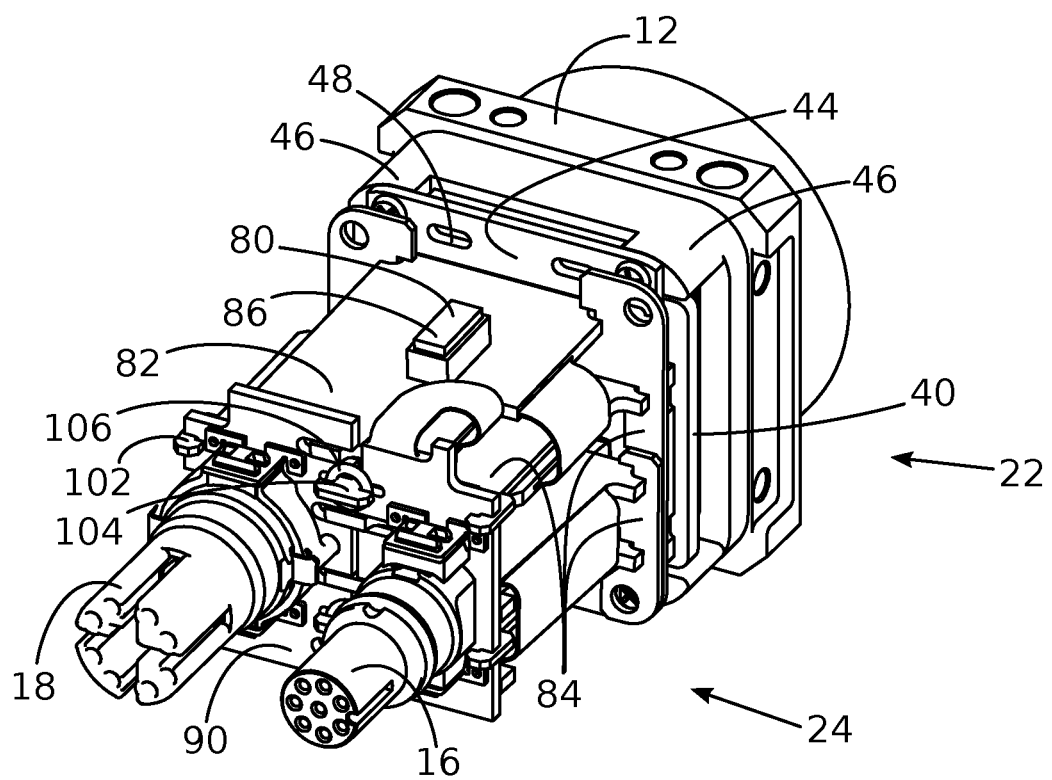
FIG. 5 is a perspective view of the portion shown in FIG. 4, showing external connectors attached to a backplane of the image processing assembly.
Figure 6:
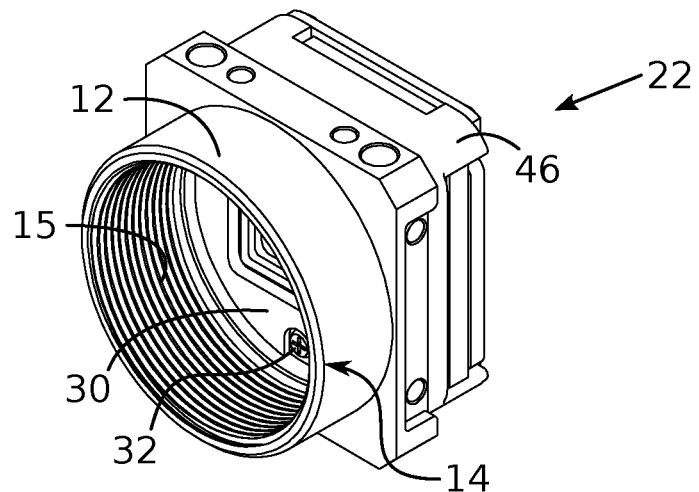
FIG. 6 is a first-angle perspective view of the image sensing assembly shown in FIGS. 4 and 5, showing the lens mount.

For clarity of illustration in FIGS. 4 and 5, the combination of the image sensing assembly 22 and the image processing assembly 24 are shown without the housing 13.

Image Sensing Assembly

Referring to FIGS. 2, 3 and 6 to 12, the image sensing assembly 22 includes in the first embodiment an optical filter 28 retained in place by a filter retainer 30. The optical filter 28 typically blocks out infra-red radiation, although in general any desired filtering effects may be suitably employed. For example, the optical filter 28 may be made of straight glass (or similar) to provide little or no filtering effect. Other filtering effects are possible, and the camera 10 in some embodiments does not include any filter 28. The filter retainer 30 is typically planar and annular, having an inner rectangular shape (FIG. 2) and an outer circular shape. In the first embodiment, a pair of screws 32 fastens the filter retainer to the lens mount 12.

Between the optical filter 28 and the image sensor 20 is a support, such as the dust seal 34 shown in FIGS. 9 to 12, for mechanically supporting the image sensor 20 prior to it being fixedly held within the image sensing assembly 22. As described further below, the dust seal 34 in the first embodiment also advantageously seals the image sensor 20 against dust or other particulate contaminants.

Figure 9:
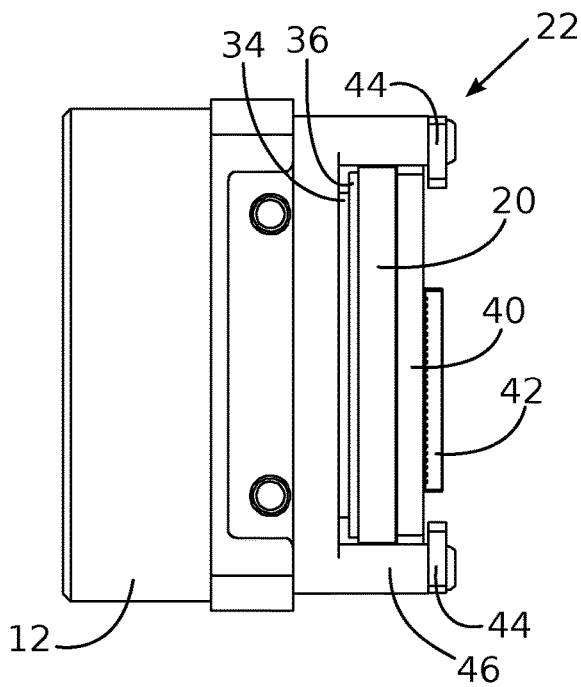
FIG. 9 is a side view of the image sensing assembly shown in FIGS. 6 and 7, showing a larger image sensor attached to the image sensor PCB.
Figure 10:
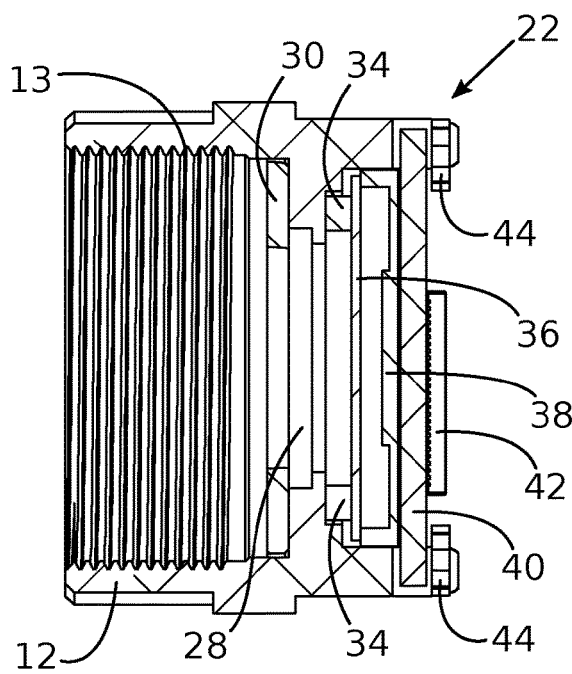
FIG. 10 is a sectional view of the image sensing assembly along lines A-A of FIG. 2, showing a support in contact with the image sensor and acting as a dust seal.
Figure 11:
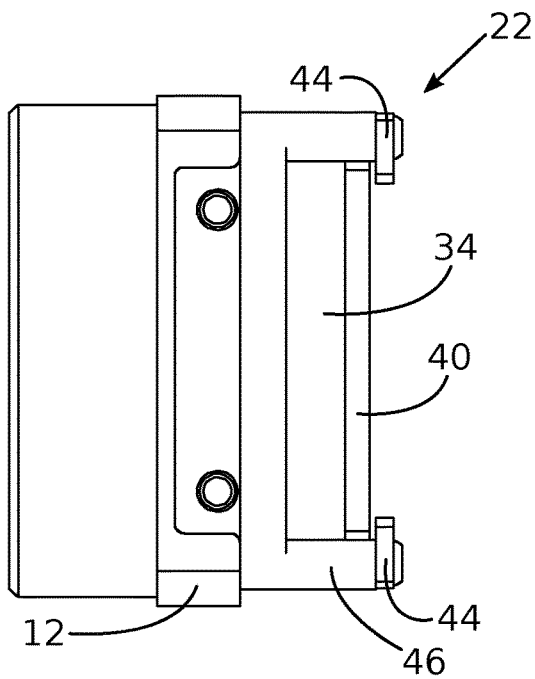
FIG. 11 is a side view of a variation of the image sensing assembly shown in FIGS. 6 and 7, showing the support covering a smaller image sensor.

In variations of embodiments, the image sensor 20 may have a variety of different sizes and shapes that can be accommodated by the image sensing assembly 22. For example, the image sensor 20 of FIGS. 9 and 10 is larger than that of FIGS. 11 and 12. For the image sensor 20 of FIGS. 9 and 10, the dust seal 34 abuts the image sensor 20, and typically contacts the glass exterior face 36 of the image sensor 20. For the image sensor 20 of FIGS. 11 and 12, however, the dust seal 34 circumscribes sides of the smaller image sensor 20, as can be seen in cross-section in FIG. 12. In either case of the larger or smaller image sensor 20, the dust seal 34 is operable to place the image sensor 20 at an initial position relative to the lens mount 12 prior to the image sensor 20 being aligned to the lens mount 12 and its flange edge 14.

Figure 12:
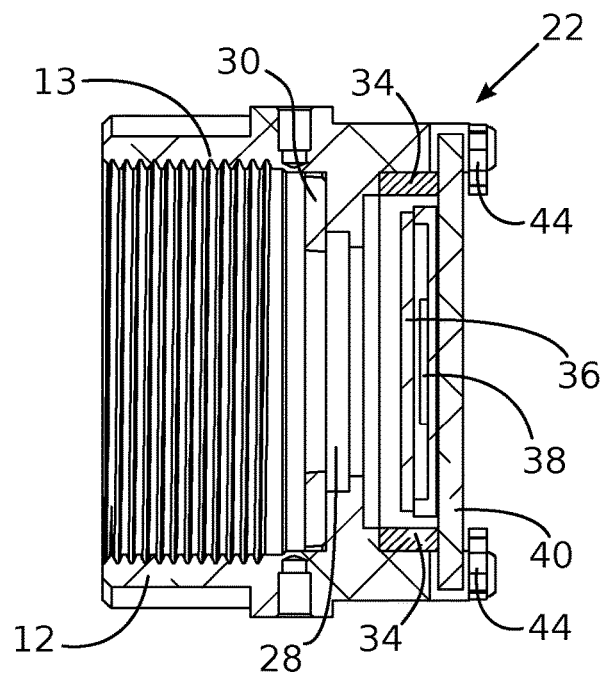
FIG. 12 is a sectional view of the variation shown in FIG. 11 along lines A-A indicated in FIG. 2, showing the support surrounding the smaller image sensor and acting as the dust seal.

As best seen in FIGS. 10 and 12, the image sensor 20 includes its exterior face 36 and an active area 38. The image sensor 20 is attached to an image sensor PCB (Printed Circuit Board) 40 on one side of the image sensor PCB 40. Attached to the image sensor PCB 40 on its opposing side is an image sensor connector 42 (visible in FIGS. 8 and 9). The image sensor connector 42 is dimensioned to receive the electrical cable 26 (FIGS. 3 and 4) that connects the output of the image sensor 20 of the image sensing assembly 22 to an input of the image processing assembly 24.

The dust seal 34 in the first embodiment resiliently supports the image sensor 20 so as to permit the image sensor 20 to move within constrained limits described further herein below. The dust seal 34 may be made of any suitable material, including an elastic material for example. In the first embodiment, the dust seal 34 is made of a foam material, although in variations other materials may be employed such as a rubber material, for example, which may be formed as molded rubber.

Before the image sensor 20 is fixed in place, the image sensor 20 in the first embodiment is captively held by a holder, such as the pair of rails 44 shown in FIGS. 7 and 9 to 12. The rails 44 are fastened to the lens mount 12 on opposing sides of the lens mount 12, and extend across each side between fastening posts 46 (FIGS. 4 to 7) of the lens mount 12.

Referring to FIGS. 6 to 12, the image sensor 20 is disposed between the dust seal 34 and the rails 44, with the dust seal 34 typically resiliently urging the image sensor 20 towards the rails 44. When the image sensor 20 is not fixedly attached to the rails 44, then the image sensor 20 is moveable against the resilient or elastic dust seal 34 such that the image sensor 20 can be considered captively held by the pair of rails 44. In variations, the image sensor 20 holder need not necessarily be in the form of a pair of rails 44. For example, the image sensor 20 holder in some embodiments extends as a single planar object across the entire width and length of the lens mount 12 between the four fastening posts 46. Such single planar object may be a single printed circuit board, for example. In the first embodiment the pair of rails 44 are printed circuit boards, although in variations other suitable objects or materials may be employed.

In general, the image sensor 20 holder in the first embodiment may take any suitable form provided the image sensor 20 holder is operable to captively hold the image sensor 20 when the image sensor 20 is not fixedly held by the image sensor 20 holder, and the image sensor 20 and its holder are also operable to fixedly attach to each other such that the image sensor 20 is fixedly held by the image sensor 20 holder when the image sensor 20 is not merely captively held by its holder. In variations of embodiments, the image sensor 20 holder may include any number of component parts, such as by being formed as a single-piece holder (not shown) or a multiple-piece holder such as the pair of rails 44. A single-piece holder may have the shape of a rectangular frame, an "I" shape, "H" shape, or "X" shape for example. A multiple-piece holder may include any number of pieces of any suitable shapes and sizes, for example.

In some embodiments, the image sensor 20 can be removably attached to the image sensor 20 holder. In the first embodiment, the image sensor 20 can be removably attached to the pair of rails 44 by soldering the image sensor 20 to the rails 44 via the sensor image PCB 40. When soldered, the image sensor 20 is fixedly held by the rails 44 such that the image sensor 20 remains indefinitely in a fixed relation to the lens mount 12. In variations of attachment techniques, the image sensor 20 can be adhered to the rails 44, fastened to the rails 44, clipped in fixed position to the rails 44, otherwise attached to the rails 44, or any combination thereof for example. If adhered, ultraviolet (UV)—cured glue may be employed, for example. An electrical ground path may be formed between the image sensor 20 and electrical ground by the selected attachment technique and/or by a separate electrical ground path.

Figure 7:
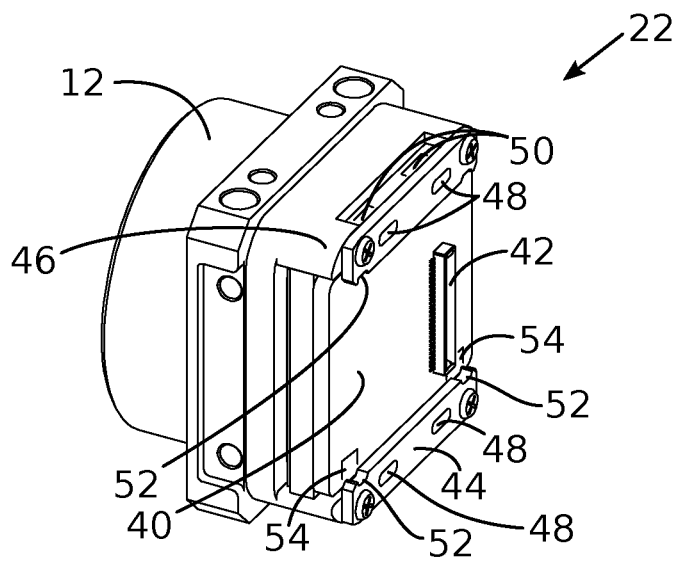
FIG. 7 is a second-angle perspective view of the image sensing assembly shown in FIG. 6, showing an image sensor PCB held by a pair of parallel, spaced-apart rails attached to the lens mount.
Figure 8:
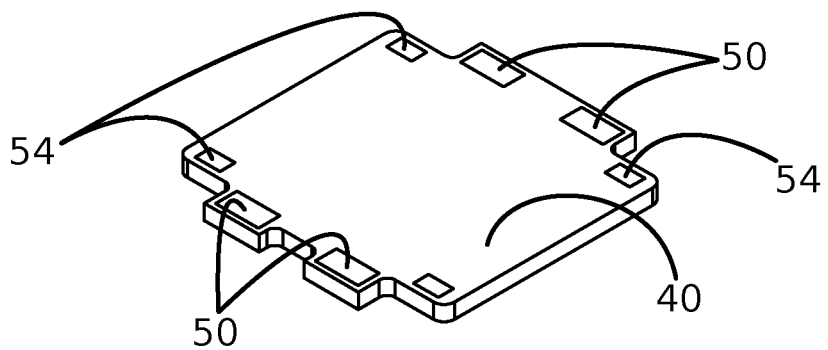
FIG. 8 is a perspective view of the image sensor PCB shown in FIG. 7, showing metallic pads and ground pads.

Referring to FIGS. 7 and 8, each rail 44 of the first embodiment includes metal-lined apertures 48 for receiving solder or similar. The metal-lined apertures 48 are in general alignment with metallic pads 50 disposed on the image sensor PCB 40 so that solder can be applied to both the metallic pads 50 and the metal-lined apertures 48 to fixedly attach the image sensor 20 to the rails 44. In the first embodiment, the thickness of the solder attaching the image sensor PCB 40 to the rails 44 is preferably no greater than 0.5 mm (0.0197 inches).

In variations of embodiments, the apertures 48 need not be metal-lined and the pads 50 need not be metallic. In some embodiments, adhesion is applied at the apertures 48, whether metal-lined or not, for fixedly adhering the image sensor PCB 40 to the rails 44 at the pads 50, whether metallic or not. In the first embodiment, the attachment of the image sensor 20 to the image sensor PCB 40 and the soldering of the sensor image PCB 40 to the rails 44 occur at opposing sides of the image sensor PCB 40. Accordingly, the thickness of the image sensor PCB 40 is relevant to the positioning of the image sensor 20 relative to the lens mount 12. For optimal performance, the thickness of the image sensor PCB 40 can be specified differently for different image sensors 20, and in particular for different image sensor 20 package types, thereby obviating a need for the use of shims during assembly of the camera 10 while accommodating an advantageous limit on solder thickness.

Still referring to FIGS. 7 and 8, the rails 44 in the first embodiment also include electrically conductive conduits 52 extending between an electrical ground connection at the fastening posts 46 to a point on the rails 44 proximate the image sensor PCB 40. The electrical conduits 52 advantageously facilitate providing a selectable electrical ground connection between the image sensor 20 and the housing 13, by permitting the electrical connection to be made by soldering between the conduits 52 and proximate electrical ground pads 54 on the image sensor PCB 40. The ability to selectably ground the image sensor 20 to the housing 13 advantageously facilitates soldering the image sensor 20 to the rails 44. For example, the image sensor 20 can be soldered in place prior to electrically grounding the image sensor 20, thereby advantageously minimizing the likelihood of an undesirably poor solder joint and/or heat warping of the rails 44 so as to cause misalignment of the image sensor 20 relative to the lens mount 12 and its flange edge 14. Thereafter, electrical grounding can be provided to the image sensor 20 when the image sensor 20 has been fixed in place. Typically, the image sensor connector 42 also provides electrical grounding, however, further electrical grounding via the electrical conduits 52 advantageously enhances ground current capacity, facilitates electromagnetic shielding, and provides a cooling path from the image sensor 20 to the lens mount 12.

Thus, there is provided a camera comprising: (a) a lens mount; (b) an image sensor for sensing images; and (c) a holder for holding the image sensor, the holder being operable to captively hold the image sensor such that the image sensor is moveable relative to the lens mount, and operable to fixedly hold the image sensor such that the image sensor is unmoveable relative to the lens mount.

In some embodiments, the image sensor 20 is not captively held by a holder before the image sensor 20 is fixed in place. In such embodiments, the image sensor 20 is non-captively aligned while being gripped when proximate to the rails 44 or other image sensor 20 holder, and then attached to the lens mount 12, such as by attaching the image sensor 20 to the pair of rails 44. For example, the image sensor PCB 40 may be soldered to the pair of rails 44 on the side of the rails 44 opposite to that soldered in the first embodiment. In such embodiments, the rails 44, metal-lined apertures 48, electrical conduits 52, image sensor PCB 40, metallic pads 50, ground pads 54, and other camera 10 components may be varied in respective positioning and size and/or omitted entirely.

Thus, there is provided a camera comprising: (a) a lens mount; (b) an image sensor for sensing images; and (c) a holder for holding the image sensor, the holder being operable to fixedly hold the image sensor such that the image sensor is unmoveable relative to the lens mount subsequent to the image sensor having been aligned by gripping the image sensor when the image sensor is moveably proximate to the holder.

Method of Installing the Image Sensor into the Image Sensing Assembly

Further advantageous features of the camera 10 will become apparent from methods of installing the image sensor 20.

Figure 13:
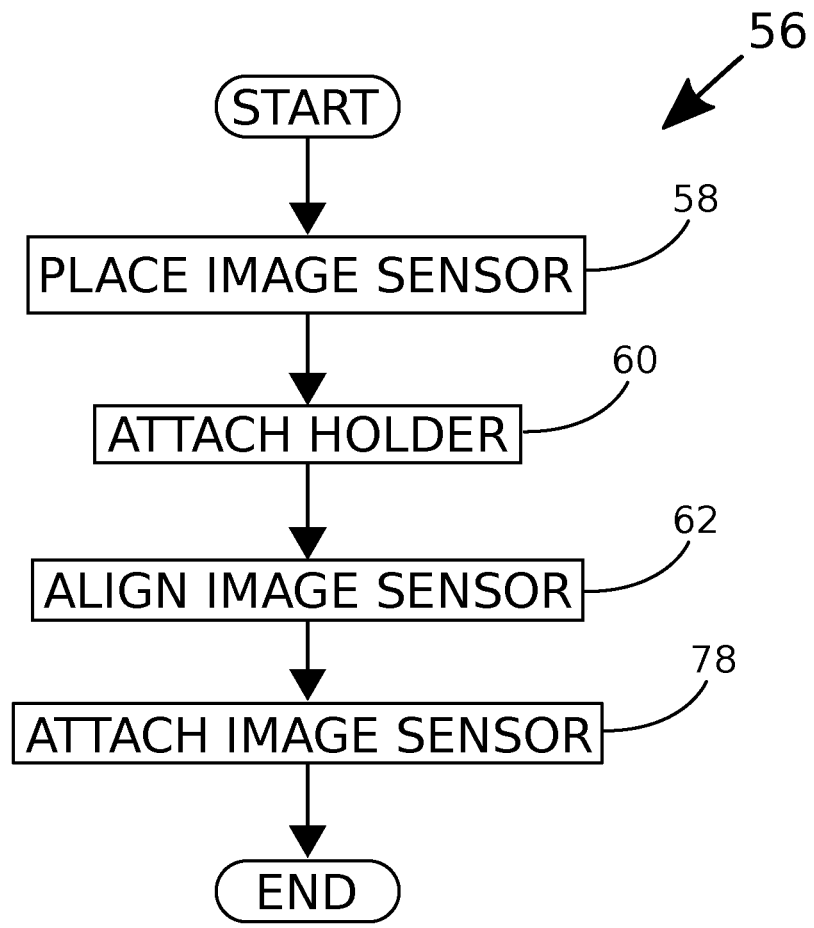
FIG. 13 is a flow diagram of a method of installing the image sensor into the image sensing assembly shown in FIGS. 6 and 7, showing the step of aligning the image sensor.

Referring to FIG. 13, an exemplary method of installing the image sensor 20 is shown generally at 56. Method 56 begins at step 58, which directs the installer to place the image sensor 20. The installer may be a human, automated equipment, industrial robot, or any combination thereof for example. In the first embodiment, placing the image sensor 20 typically involves placing the image sensor 20 at the lens mount 12 so that the image sensor 20 is supported by the dust seal 34. In the first embodiment, placing the image sensor 20 at the lens mount 12 typically involves placing the image sensor PCB 40 at the lens mount 12 so that the image sensor 20 and/or the image sensor PCB 40 is supported by the dust seal 34 when the image sensor 20 is attached to the image sensor PCB 40.

After step 58 has been executed, step 60 directs the installer to attach an image sensor 20 holder. In the first embodiment, attaching the image sensor 20 holder typically involves fastening the pair of rails 44 to the lens mount 12 at the fastening posts 46. Executing step 60 advantageously ensures the image sensor 20 is captively held.

After step 60 has been executed, step 62 directs the installer to align the image sensor 20.

Figure 14:
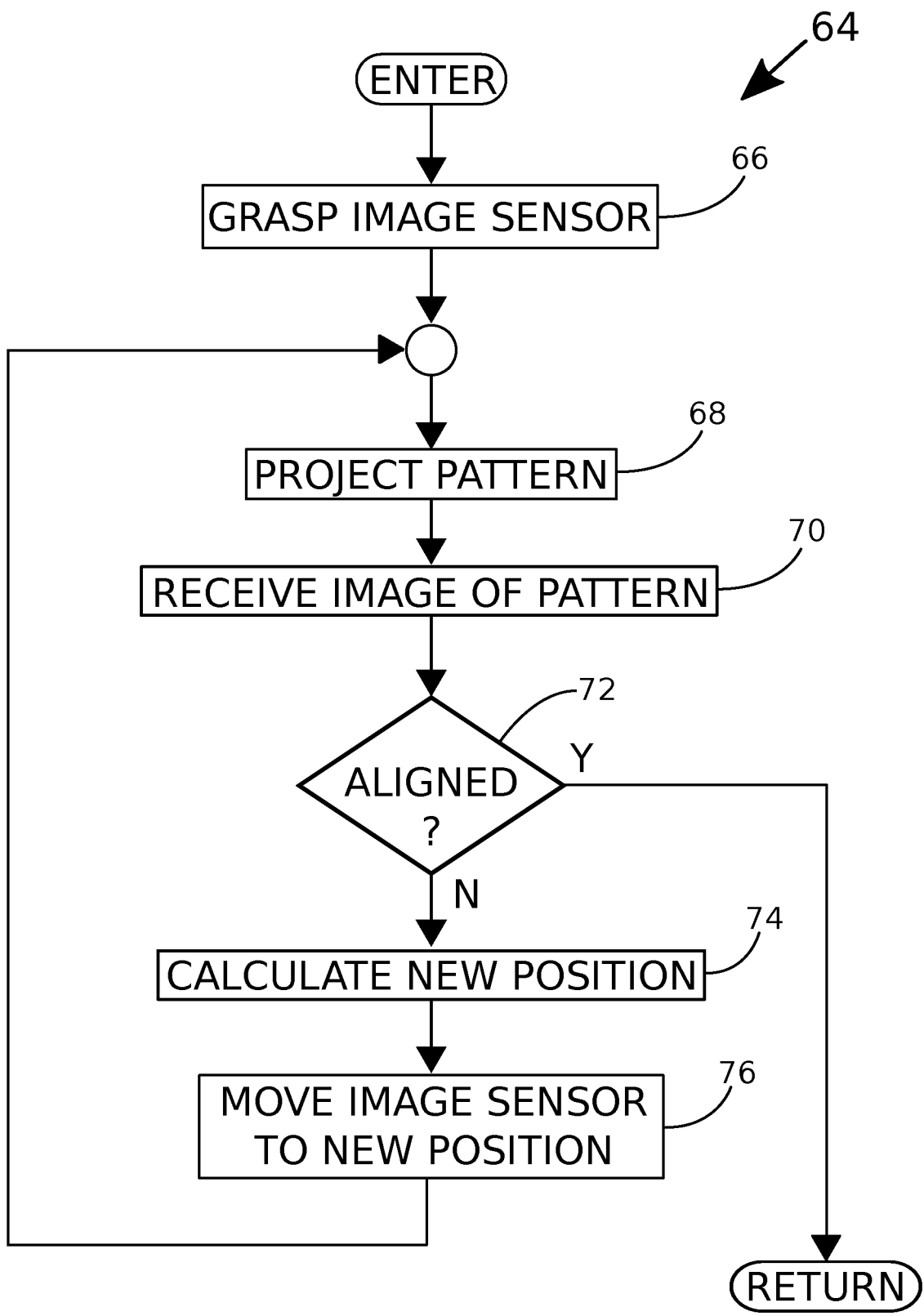
FIG. 14 is a flow diagram of a method of performing the step of aligning the image sensor shown in FIG. 13, showing the step of moving the image sensor to a new position.

Referring to FIG. 14, an exemplary method for carrying out step 62 (FIG. 13) is shown generally at 64. Method 64 begins at step 66, which directs the installer to grasp the image sensor 20. In the first embodiment, grasping the image sensor 20 typically involves gripping, by opposed fingers of an industrial robot (not shown), the image sensor PCB 40 to which the image sensor 20 is attached. However, in general any suitable method of grasping may be employed. Executing step 66 may also involve placing the image sensing assembly 22 in a suitable jig (not shown) for enhanced stability during the alignment operation, and may involve aligning various components of the jig to each other, aligning a jig component to the lens mounts 12 and its flange edge 14, and/or or mating a jig component to the threads 13 of the lens mount 12. Placing the image sensing assembly 22 in the jig may involve electrically powering the image sensing assembly 22 and in particular the image sensor 20.

In some embodiments (not shown) in which the camera 10 includes a non-interchangeable and/or non-removable lens, the lens mount 12 does not have exposed threads 15 for receiving jig components. For example, during manufacturing a non-interchangeable and/or non-removable lens may be permanently threaded onto the threads 15, such as by the use of adhesion applied to the threads 15. In such embodiments, the position of the image sensor 20 is adjusted for optimal image quality produced by the image sensing assembly 22 when it includes the non-interchangeable lens, rather than aligning the image sensor 20 relative to the lens mount 12 and its flange edge 14.

After step 66 has been executed, step 68 directs the installer to project an optical pattern towards image sensor 20 (FIG. 3). In the first embodiment, a pattern projector (not shown) is used for this purpose. In general, any known optical pattern may be employed, and some optical patterns may better facilitate alignment of the image sensor 20 than others. For a visible light (e.g. computer-vision or security surveillance) camera 10, the optical pattern is typically a pattern of light in the visible region of the electromagnetic spectrum. For an infra-red camera 10, the optical pattern can be a light pattern in the infra-red region of the electromagnetic spectrum, for example. Other examples are within the scope contemplated by the present invention. Additionally or alternatively, projecting the optical pattern may involve presenting a mechanical object to be imaged by the imaging sensor 20. For example, an indicator of the top (or bottom or side) of the lens mount 12 may be presented for imaging so as to facilitate rotational alignment of the imaging sensor 20 to the lens mount 12 and its flange edge 14.

Additionally or alternatively, method 64 in some embodiments involves employing a system for measuring a distance, such as the distance between the flange edge 14 and the image sensor 20 and/or its active area 38 (FIG. 3). Such system may include a laser-based distance sensor for directing a narrow beam of electromagnetic radiation toward the image sensor 20 that is then reflected from the image sensor 20 or a portion thereof. In such embodiments, steps 68 and 70 can be performed without electrically powering the image sensor 20.

After step 68 has been executed, step 70 directs the installer to receive image(s) of the optical pattern via the image sensor 20. In the first embodiment, receiving image(s) of the optical pattern typically involves connecting a camera processor (not shown) to the image sensor 20 at the image sensor connector 42 (FIGS. 7 and 9), and may involve displaying received image(s). Such connected camera processor typically operates in a manner similar or analogous to that of the image processing assembly 24 (FIGS. 3 to 5), and may form part of the jig or related equipment (not shown) employed for aligning the image sensor 20.

When the image(s) are received, the installer may optionally cease projecting the pattern of step 68, such as to minimize power consumption for example. Shutting off the pattern projector (not shown) may form part of step 70 or form a separate step, for example. Alternatively, the pattern may continue to be projected throughout the duration of multiple steps of the method 64.

After step 70 has been executed, step 72 directs the installer to determine whether the image sensor 20 is aligned. Typically, such determination is conducted by a computerized processor (not shown) having an associated memory circuit (not shown) storing codes for directing operations of the computerized processor. The determination in the first embodiment is typically determined by calculating an error representing a comparison of the actual image(s) received from the image sensor 20 and an expected image based on the known optical pattern of step 68. The representation of the calculated error may be in any suitable form, including in the form of scalar value(s), vector(s), matrix or matrices, etc.

If by step 72 the installer determines that the image sensor 20 is not adequately aligned, then the process proceeds to step 74.

Step 74 directs the installer to calculate an expected aligned position of the image sensor 20. The calculated position is a result of determining where the image sensor 20 needs to be moved to in order to zero out the calculated error of step 72. Typically, such calculation of the expected aligned position is computer-implemented, such as being performed by the processor (not shown) of step 72.

While FIG. 14 shows step 66 preceding step 68, in general step 66 may be executed at any time before, during or after executing steps 68 to 74, including possibly performing multiple steps simultaneously. In general, step 66 is executed prior to executing a first instance of step 76. In the first embodiment, step 66 is preferably executed prior to executing step 72 so as to advantageously avoid the possibility of moving the image sensor 20 to an unpredictable position when it is grasped.

After step 74 has been executed, step 76 directs the installer to move the image sensor 20 to the calculated position. In the first embodiment, the fingers of the industrial robot (not shown), grasping the image sensor 20 according to step 66, are employed to move the image sensor 20 to the calculated position for alignment with the lens mount 12.

After step 76 has been executed, the method returns to step 68 for confirmation of alignment and/or further alignment.

In general, the steps 68 to 76, or portions thereof, may be iterated any number of times. In some embodiments, these steps or portion thereof are iterated so that step 76 is performed a fixed number of times, such as once, twice or three times for example. In some embodiments, these steps or portion thereof are iterated so that the step 76 is performed as many times as necessary to achieve a desired small error value. In some embodiments, an error routine (not shown) is performed upon step 76 being executed a large number of times while determining by step 72 that the image sensor 20 is not adequately aligned. In some embodiments, an error routine (not shown) is performed upon detecting a discrepancy between measured and expected positions of the image sensor 20, such as alerting a user as to the possibility of a mechanical interference preventing the image sensor 20 from arriving at the expected aligned position calculated by step 74. Other combinations are possible.

If by step 72 the installer determines that the image sensor 20 is properly aligned (i.e. within an acceptable margin of error) to the lens mount 12 and, accordingly, aligned to the flange edge 14 or non-interchangeable lens (not shown), then the method 64 ends and the process returns to the method 56 (FIG. 13) at step 78 thereof.

Referring back to FIG. 13, step 78 directs the installer to attach the image sensor 20. In the first embodiment, attaching the image sensor 20 typically involves attaching the image sensor 20 to each of the rails 44 by soldering the image sensor PCB 40 to the rails 44 while the image sensor 20 remains in its aligned position by continued grasping by the robotic fingers (not shown). The image sensor 20 is advantageously disposed inward of the rails 44 so that the image sensor 20 and the rails 44 can be soldered together without soldering equipment, such as a soldering iron (not shown), or other solid matter coming into physical contact with the image sensor 20 itself or the image sensor PCB 40. Avoiding such physical contact with an aligned image sensor 20 advantageously minimizes the likelihood of causing the image sensor 20 to move out of alignment. In some embodiments, the soldering is performed manually by a human installer (not shown). In some embodiments, however, the soldering is performed by an automated installer such as an industrial robot (not shown).

After the image sensor 20 and the rails 44 are soldered together or otherwise attached to each other, such as by soldering the image sensor PCB 40 to the rails when the image sensor 20 is soldered to the image sensor PCB 40, the image sensor 20 is in a fixed relation to the rails 44 and thus fixedly held by the rails 44 so as to be aligned to the lens mount 12. When the image sensor 20 is being fixedly held by the rails 44, the robotic fingers can be removed from holding the image sensor 20, the lens mount 12 can be removed from its jig, and the pattern projector can cease projecting patterns, if desired for example.

After the image sensor 20 and the rails 44 are soldered together, the dust seal 34 (FIGS. 6 to 12) is no longer needed to provide support to the fixedly held image sensor 20, but advantageously continues to provide sealing against dust or other contaminants from impinging on the exterior face 36 of the image sensor 20.

While in the first embodiment the image sensor 20 is attached to the image sensor 20 holder by soldering the image sensor PCB 40 to the rails 44 when the image sensor 20 is soldered to the image sensor PCB 40, other arrangements and techniques may be employed for attaching the image sensor 20 to the image sensor 20 holder. In some embodiments, the image sensor PCB 40 is omitted or substituted by other objects or means as may be apparent to a person of ordinary skill, for example. In some embodiments, other attachment techniques such as adhering, fastening and/or clipping may be employed.

After step 78 has been executed, the method 56 ends.

Thus, there is provided a method of installing an image sensor of a camera, the method comprising: (a) placing the image sensor at a lens mount of the camera; (b) fastening a holder to the lens mount so as to captively hold the image sensor by the holder such that the image sensor is moveable relative to the lens mount; (c) aligning the image sensor to the lens mount; and (d) attaching the image sensor to the holder so as to fixedly hold the image sensor by the holder such that the image sensor is unmoveable relative to the lens mount.

In some embodiments, step 58 and step 60 of FIG. 13 are reversed such that the image sensor 20 holder, such as the pair of rails 44, does not captively hold the image sensor 20. In such embodiments, the image sensor 20 is grasped, such as by grasping the image sensor PCB 40 when the image sensor 20 is attached to the image sensor PCB 40, at any suitable location proximate to the image sensor 20 holder after the image sensor 20 holder has been attached. Upon grasping the image sensor 20 in proximity to the image sensor 20 holder, the image sensor 20 can then be aligned in accordance with step 62 for attachment in accordance with step 78 as shown in FIG. 13.

Thus, there is provided a method of installing an image sensor of a camera relative to a lens mount of the camera, the method comprising: (a) fastening to the lens mount a holder operable to hold the image sensor; (b) grasping by a gripper the image sensor proximate to the holder; (c) by the gripper, aligning the image sensor to the lens mount; and (d) attaching the image sensor to the holder such that the image sensor is unmoveable relative to the lens mount.

Image Processing Assembly

Referring back to FIGS. 3 to 5, the image processing assembly 24 includes electronic components 80 for processing digital images. For example, images received by the image sensor 20 can be combined into data packets for video streaming. In some embodiments the camera 10 is operable to perform digital filtering of the digital images, for example.

Figure 15:
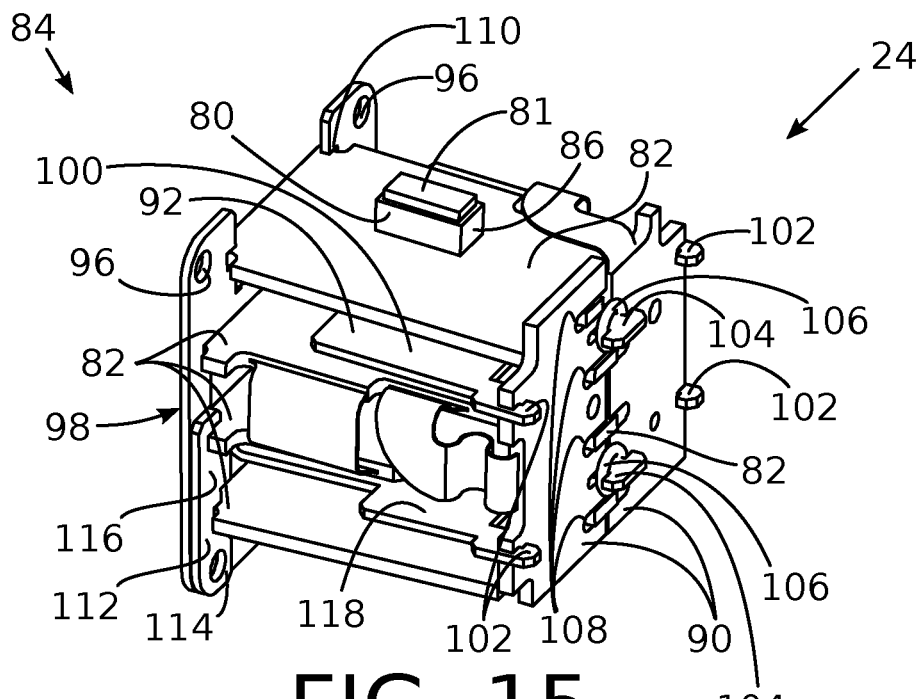
FIG. 15 is a first-angle perspective view of the image processing assembly shown in FIGS. 4 and 5 without the external connectors, showing two backplane sections and resilient attachment between the backplane and a PCB (Printed Circuit Board) holder.
Figure 16:
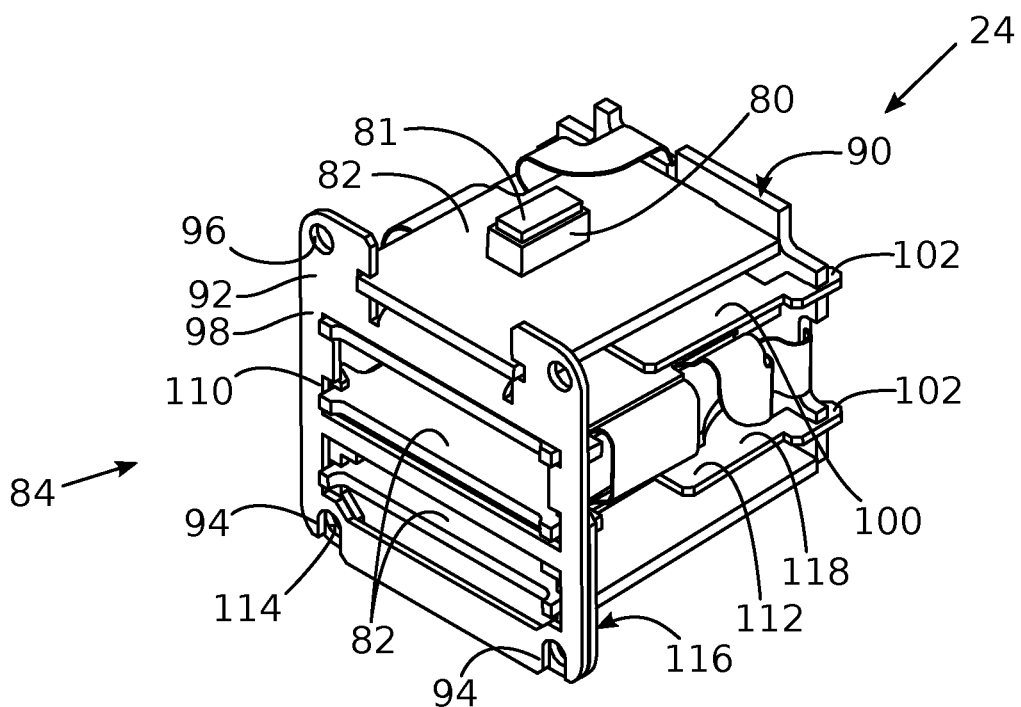
FIG. 16 is a second-angle perspective view of the image processing assembly shown in FIG. 15, showing a slotted flange and an unslotted flange adjacently parallel to each other.

For clarity of illustration in FIGS. 15 and 16, the image processing assembly 24 is shown without the external connectors 16 and 18 (FIG. 5). Various electronic components 80 are supported by one or more printed circuit boards 82 that are held by a PCB (Printed Circuit Board) holder 84.

In the first embodiment, the one or more printed circuit boards 82 are implemented by flexible electronics such as a single flexible printed circuit (FPC). However, in some embodiments all of the printed circuit boards of the camera 10 are rigid, preferably with cabled connections therebetween as may be needed. In variations, any suitable parts of the camera 10 may be implemented by flexible electronics. For example, in some embodiments all of the printed circuit boards of the camera 10, including the image sensor PCB 40 (FIG. 3) and the one or more printed circuit boards 82, are implemented by one or more FPCs. In some embodiments, all of the printed circuit boards, including their connectors such as the image sensor connector 42 (FIG. 3), and all of the electrical connections between printed circuit boards, including the electrical cable 26 (FIG. 3), of the camera 10 are implemented by a single FPC, for example.

Referring to FIGS. 3 to 5 and 15 to 16, at least some of the electronic components 80 generate heat that can be dissipated through heat sinking. To advantageously achieve a compact size for the camera 10, the housing 13 itself in the first embodiment acts as a heat sink. In the first embodiment, one or more outer electronic components 86 are in thermal communication with the housing 13, which may include being in thermal contact with a thermal interface material, such as the thermal pads 81 shown in FIGS. 3, 4, 15 and 16, that is disposed between each outer electronic component 86 and the housing 13 for example. In variations of embodiments, the thermal interface material can be implemented by thermal paste, thermal compound, the thermal pads 81, other thermal interface materials, or any combination thereof for example.

Referring particularly to FIG. 3, in some embodiments the opposing inward-facing sides of the housing 13 are not parallel to each other, but rather angled relative to each other such that the interior of the housing 13 has a draft or taper. In the embodiment of FIG. 3, such draft causes the distance between the opposing inward-facing sides of the housing 13 to be greater near the image sensing assembly 22 than it is further away from the image sensing assembly 22.

As shown in FIG. 3, in embodiments having one or more outer electronic components 86 in thermal contact with the housing 13, such outer electronic components 86 are aligned with one or more inward-facing sides of the housing 13. In embodiments having a plurality of outer electronic components 86 in thermal contact with opposing inward-facing sides of the housing 13, such opposing outer electronic components 86 are not parallel to each other. Also, printed circuit boards 82 supporting such opposing outer electronic components 86 are not parallel to each other when at least at the portions of such printed circuit boards 82 that are supporting the opposing outer electronic components 86 are aligned with the opposing sides of the housing 13. Such non-parallel arrangement of the printed circuit boards 82 advantageously facilitates thermal contact between one or more outer electronic components 86 and the housing 13.

As shown in FIG. 3, in embodiments having one or more outer electronic components 86 in thermal contact with the housing 13 and supported by one or more rigid printed circuit boards 82, such rigid printed circuit boards 82 are aligned with one or more inward-facing sides of the housing 13. In embodiments having a plurality of rigid printed circuit boards 82 in which each rigid printed circuit board 82 supports at least one outer electronic component 86 requiring thermal contact with the housing 13, the rigid printed circuit boards 82 are not parallel to each other when their respective outer electronic components 86 are in thermal contact with corresponding inward-facing sides of the housing 13.

For further advantageous thermal management, the PCB holder 84 itself in the first embodiment acts as a heat sink for one or more inner electronic components 88.

In general, any number of electronic components 80 supported by any number of printed circuit boards 82 may be in thermal communication with the housing 13, the PCB holder 84, other heat sinks, or any combination thereof for example. Either or both inward facing sides of the housing 13 may suitably be employed as a heat sink for electronic components 80. Multiple parts of the PCB holder 84 may suitably be employed as a heat sink for electronic components 80.

Still referring to FIGS. 3 to 5 and 15 to 16, the printed circuit boards 82 are held by the PCB holder 84 in conjunction with a backplane 90. In the first embodiment, the backplane 90 is advantageously composed of a pair of backplane 90 sections. Preferably, one external connector 16 is attached to one backplane 90 section and the other external connector 18 is attached to the other backplane 90 section, thereby advantageously providing mechanical tolerances to permit the backplane 90 sections to move relative to each other when the connectors 16 and 18 are fit into the housing 13. In the first embodiment, the backplane 90 sections are generally restricted to lie at all times within substantially parallel planes.

Referring to FIGS. 15 to 19, the PCB holder 84 in the first embodiment includes a slotted member 92 having a pair of loose-fit openings such as the open-ended slots 94 shown in the Figures. Opposite the open-ended slots 94 is a pair of closed apertures 96 of the slotted flange 98. The slots 94 and apertures 96 are dimensioned to receive fasteners (not shown) for fastening the slotted member 92 to the housing 13. In variations of embodiments, the loose-fit openings may be oversized apertures such as oversized round holes, closed elongated slots, open-ended elongated slots as shown in the Figures, or any other-shaped large-clearance openings dimensioned for receiving a fastener when the PCB holder 84 lies within a range of different positions so as to provide a loose fit for the fasteners.

An adjoining plate 100 extends at, or nearly at, a right angle to the slotted flange 98 intermediate between the slots 94 and apertures 96. The adjoining plate 100 includes side clips 102 and a central clip 104 at an end distal from the slotted flange 98. The side clips 102 and the central clip 104 are operable to removably attach the slotted member 92 to the backplane 90. The central clip 104 works in conjunction with an elastic ring 106 (FIG. 15) for resilient attachment between the PCB holder 84 and the backplane 90. Such resilient attachment advantageously holds together the PCB holder 84, backplane 90, and the printed circuit boards 82. In the first embodiment, the printed circuit boards 82 are held between the backplane 90 and the slotted flange 98. In the first embodiment, slots 108 are formed between the backplane 90 sections, and cut-outs 110 in the slotted flange 98 facilitate holding the printed circuit boards 82 between the backplane 90 and the slotted flange 98.

Referring to FIGS. 20 and 21, the PCB holder 84 in the first embodiment also includes an unslotted member 112 having a pair of apertures 114 in an unslotted flange 116. The apertures 114 are dimensioned to receive fasteners (not shown) for fastening the unslotted member 112 to the housing 13. A plate 118 extends at a right angle to the unslotted flange 116. At an end distal from the unslotted flange 116 are another pair of side clips 102 and another central clip 104 operable to removably attach the unslotted member 112 to the backplane 90. The central clip 104 of the unslotted member 112 is also retained in place by an elastic ring 106 (FIG. 15) for resilient attachment between the PCB holder 84 and the backplane 90. Further printed circuit boards 82 are held between the backplane 90 and the unslotted flange 116 at further slots 108 of the backplane 90 and at cut-outs 110 of the unslotted flange 116, respectively.

When the PCB holder 84 and backplane 90 are attached to each other, the slotted flange 98 and the unslotted flange 116 rest adjacently parallel to each other. The resilient nature of the attachment between the PCB holder 84 and the backplane 90 permits the flanges 98 and 116 to adjustably slide relative to each other while generally maintaining their adjacently parallel relationship. The sliding distance of the flanges 98 and 116 that can be travelled is limited by the angle between the PCB holder 84 and the backplane 90 permitted by the resilient connection therebetween. Being resiliently slidable relative to each other advantageously facilitates fastening the flanges 98 and 116 to the housing 13. In the first embodiment, the apertures 114 of the unslotted member 112 preferably align with the slots 94 of the slotted member 92. The longitudinal nature of the slots 94 accommodate sliding of the slotted flange 98 relative to the unslotted flange 116, while advantageously permitting a fastener (not shown) to fasten an aligned slot 94 and aperture 114 to the housing 13. The relative slidability of the flanges 98 and 116 further advantageously facilitates fastening the image processing assembly 24 to the housing so as to place one or more outer electronic components 86 in thermal communication with the housing 13 (see FIG. 3, for example).

Referring to FIGS. 3 to 5 and 15 to 21, the slotted flange 98 extends from one inner side of the housing 13 (FIG. 3) to the opposite inner side of the housing 13, thereby advantageously providing additional support against mechanical pressure or force sustained due to external use of the connectors 16 and 18.

Still referring to FIGS. 3 to 5 and 15 to 21, the adjoining plate 100 of the slotted member 92 and the plate 118 of the unslotted member 112 advantageously act as heat sinks for a number of the inner electronic components 88. In the first embodiment, both sides of the plates 100 and 118 can be employed for heat sinking. Assembling the image processing assembly 24 by attaching the PCB holder 84 and the backplane 90 to each other advantageously renders selected inner electronic components 88 in thermal communication with the plates 100 and/or 118, which may include rendering in thermal contact with the thermal pad 81 (FIGS. 3, 4, 15 and 16) or other thermal interface material disposed between each such inner electronic component 88 and the PCB holder 84 for example.

In the first embodiment, fastening the PCB holder 84 to the housing 13 advantageously places the PCB holder 84 in thermal communication with the housing 13, so as to provide a cooling path from the inner electronic components 88 via the PCB holder 84 to the housing 13.

Thus, there is provided a camera comprising: (a) a first printed circuit board supporting a first circuit component; (b) a second printed circuit board; (c) a PCB holder for holding the first and second printed circuit boards spaced apart from each other and pivotable relative to each other; and (d) a housing for enclosing the first and second printed circuit boards and the PCB holder, the PCB holder being dimensioned for fastening to the housing such that the first and second printed circuit boards are not parallel to each other and the first circuit component is placed in thermal communication with the housing.

Method of Installing the Image Processing Assembly into the Housing

Referring to FIGS. 3, 15 and 16, the image processing assembly 24 is inserted into the housing 13 when the lens mount 12 and the image sensing assembly 22 are not fastened to the housing 13 and after the image processing assembly 24 is fully assembled, including possibly applying thermal interface material to electronic components 80 and/or inward-facing sides of the interior of the housing 13.

The image processing assembly 24 end closest to the external connectors 16 and 18 is first inserted into the housing 13 until the connectors 16 and 18 are received through respective apertures of the housing 13 that are dimensioned for receiving the connectors 16 and 18, as can be seen in FIG. 3. The camera 10 is operable to seal the housing 13 apertures when the connectors 16 and 18 are received, such as by including seals, gaskets, grommets or other sealing material (not shown). Sealedly receiving the external connectors 16 and 18 advantageously minimizes or eliminates the ingress of dust and/or fluids, such as water, into the interior of the housing 13.

After the external connectors 16 and 18 are fully seated against their respective housing 13 apertures at one end of the housing 13, the slotted flange 98 and the unslotted flange 116 are disposed at the other end of the housing 13 opposite the external connectors 16 and 18. Sliding the unslotted flange 116 as necessary until its apertures 114 are aligned with corresponding threaded holes (not shown) of the housing 13 and sliding the slotted flange 98 as necessary until its closed apertures 96 are aligned with corresponding threaded holes (not shown) of the housing 13 places outer electronic components 86 in thermal communication with one or both opposing inward-facing sides of the housing 13. Doing so also aligns the printed circuit boards 82 to become parallel to the inward-facing sides of the housing 13. In the embodiment of FIG. 3, the opposing inward-facing sides of the housing 13 are not parallel to each other. Accordingly, the printed circuit boards 82 are not parallel with each other when they are respectively parallel to the opposing interior side faces of the housing 13 as shown in FIG. 3.

After the apertures 114, open-ended slots 94 and the closed apertures 96 are aligned, fasteners (not shown) such as screws or bolts are employed to fasten the slotted flange 98 and the unslotted flange 116 to the housing 13. In variations of embodiments, the image processing assembly 24 may be fastened prior to or in conjunction with fastening the image sensing assembly 22 or parts thereof.

Thus, there is provided a method of installing an image processing assembly of a camera having a housing, the method comprising: (a) inserting the image processing assembly into the housing such that an external connector of the image processing assembly sealedly extends through an aperture of the housing disposed at a first end of the housing; (b) sliding at least one of first and second flanges of a PCB holder of the image processing assembly relative to the other of the first and second flanges until first and second printed circuit boards of the image processing assembly are not parallel to each other and a first circuit component supported by the first printed circuit board is placed in thermal communication with the housing; and (c) fastening the first and second flanges to the housing at a second end of the housing opposite the first end.

While embodiments of the invention have been described and illustrated, such embodiments should be considered illustrative of the invention only. The invention may include variants not described or illustrated herein in detail. Thus, the embodiments described and illustrated herein should not be considered to limit the invention as construed in accordance with the accompanying claims.

What is claimed is:
1. A camera comprising:
   (a) a lens mount;
   (b) an image sensor for sensing images; and
   (c) a holder for holding the image sensor, the holder being operable to captively hold the image sensor such that the image sensor is moveable relative to the lens mount when the image sensor is captively held and not attached to the holder, the holder being further operable to fixedly hold the image sensor such that the image sensor is unmoveable relative to the lens mount at an aligned position of the image sensor when the image sensor is attached to the holder.

2. The camera of claim 1 wherein the holder comprises first and second rails removably attachable to the lens mount at opposing sides of the lens mount.

3. The camera of claim 2 wherein the first and second rails comprise first and second printed circuit boards, respectively, the image sensor being attached to a printed circuit board, the holder fixedly holding the image sensor by solder extending between the printed circuit board and each of the first and second printed circuit boards.

4. The camera of claim 3 wherein the printed circuit board has a thickness selected such that a solder thickness of the solder is less than or equal to 0.5 mm.

5. The camera of claim 1 wherein the holder is a single-piece holder.

6. The camera of claim 1 further comprising a support for resiliently supporting the image sensor when the image sensor is captively held by the holder.

7. The camera of claim 6 wherein the support is made of an elastic material and is operable to seal the image sensor against dust ingress.

8. The camera of claim 7 wherein the support is made of a foam material.

9. The camera of claim 7 wherein the support is made of a rubber material.

10. A camera comprising:
    (a) a lens mount;
    (b) an image sensor for sensing images, the image sensor being attached to a printed circuit board; and
    (c) a holder for holding the image sensor, the holder comprising first and second rails comprising first and second printed circuit boards, respectively, the holder being operable to fixedly hold the image sensor by the printed circuit board being soldered to at least one of the first and second printed circuit boards such that the image sensor is unmoveable relative to the lens mount at an aligned position of the image sensor subsequent to the image sensor having been aligned by gripping the image sensor,
    wherein the holder is operable to captively hold the image sensor such that the image sensor is moveable relative to the lens mount when the image sensor is captively held and not attached to the holder, and wherein the holder is operable to fixedly hold the image sensor at said aligned position when the image sensor is attached to the holder.

11. The camera of claim 10 wherein the first and second rails are removably attachable to the lens mount at opposing sides of the lens mount.

12. The camera of claim 11 wherein the holder fixedly holds the image sensor by solder extending between the printed circuit board and each of the first and second printed circuit boards.

13. The camera of claim 12 wherein the printed circuit board has a thickness selected such that a solder thickness of the solder is less than or equal to 0.5 mm.

14. The camera of claim 10 wherein the holder is a single-piece holder.

15. The camera of claim 12 further comprising a support for resiliently supporting the image sensor when the image sensor is captively held by the holder.

16. The camera of claim 15 wherein the support is made of an elastic material and is operable to seal the image sensor against dust ingress.

17. The camera of claim 16 wherein the support is made of a foam material.

18. The camera of claim 16 wherein the support is made of a rubber material.

\* \* \* \* \*